United States Patent [19]
Rogers et al.

[11] Patent Number: 6,018,254
[45] Date of Patent: *Jan. 25, 2000

[54] NON-BLOCKING DELAYED CLOCKING SYSTEM FOR DOMINO LOGIC

[75] Inventors: Alan C. Rogers; Edgardo F. Klass, both of Palo Alto; Chaim Amir, Sunnyvale; Jason M. Hart, Mt. View, all of Calif.

[73] Assignee: Sun Microsystems, Inc., Palo Alto, Calif.

[*] Notice: This patent is subject to a terminal disclaimer.

[21] Appl. No.: 08/884,841

[22] Filed: Jun. 30, 1997

[51] Int. Cl.$^7$ .................................................. H03K 19/096
[52] U.S. Cl. ................................................. 326/96; 326/93
[58] Field of Search ................................ 326/93, 96, 97, 326/98; 327/144, 233, 295

[56] References Cited

U.S. PATENT DOCUMENTS

| | | | |
|---|---|---|---|
| 5,434,520 | 7/1995 | Yetter et al. | 326/97 |
| 5,504,441 | 4/1996 | Sigal | 326/96 |
| 5,541,536 | 7/1996 | Rajivan | 326/98 |
| 5,880,609 | 3/1999 | Klass et al. | 326/93 |

FOREIGN PATENT DOCUMENTS

| | | | |
|---|---|---|---|
| 6-197006 | 7/1994 | Japan | 326/98 |

OTHER PUBLICATIONS

Wang, J.S., et al., "Novel Dynamic CMOS Logic Free From Problems of Charge Sharing and Clock Skew," *International Journal of Electronics*, vol. 66, No. 5, pp. 679–395, May 1989.

Gaddis, N.B. et al., "A 56–Entry Instruction Reorder Buffer", *1996 IEEE International Solid–State Circuits Conference*, pp. 212–213, (1996).

Partovi, H. et al., "Flow–Through Latch and Edge–Triggered Flip–Flop Hybrid Elements", *ISSCC Slide Supplement*, p. 104, (1996).

Shoji, Masakazu, *CMOS Digital Circuit Technology*, Prentice Hall, NJ, pp. 216–217, (1988).

Yuan, Jiren et al., "A True Single–Phase–Clock Dynamic CMOS Circuit Technique", *IEEE Journal Of Solid–State Circuits*, vol. 22, Oct. 1987, pp. 899–901.

Yuan, Jiren et al., "High–Speed CMOS Circuit Technique", *IEEE Journal Of Solid–State Circuits*, vol. 24., Feb. 1989, pp. 62–70.

*Primary Examiner*—Michael Tokar
*Assistant Examiner*—Don Phu Le
*Attorney, Agent, or Firm*—McDermott, Will & Emery

[57] ABSTRACT

A non-blocking multiple-phase clocking system for use with domino-type dynamic logic provides clock phases with overlapping evaluation phases to a circuit including a several cascaded dynamic logic gates. The circuit also includes a first flip-flop that is coupled to provide input signal(s) to the first dynamic logic gate of the cascade and a second flip-flop that is coupled to receive output signal(s) from the last dynamic logic gate of the cascade. The clocking system provides a first clock phase to the first dynamic logic gate, a second clock phase to the second dynamic logic gate and so on. A timing analysis is performed of each logic path in the circuit to determine the arrival time of each critical input signals to each dynamic logic gate. The delay between adjacent clock phase is then predetermined so that each dynamic logic gate enters its evaluation phase before the critical input signal(s) to the particular dynamic logic gate arrives. This adjustment of the clock phases maximizes the logic evaluation speed of the dynamic logic circuit.

20 Claims, 7 Drawing Sheets

NON-BLOCKING DELAYED CLOCKING SYSTEM FOR DOMINO LOGIC

"This application claims the priority benefit of application Ser. No. 08/788,710, filed on Jan. 23, 1997, now issued as U.S. Pat. No. 5,880,609, on Mar. 9, 1999, under 35 USC 120."

FIELD OF THE INVENTION

The present invention relates to clocking systems and, more particularly, to clocking systems for circuits with domino logic gates.

BACKGROUND

Some high performance circuits such as, for example, microprocessors, are implemented using dynamic logic gates. As is well known, dynamic logic gates in general allow the design of faster circuits compared to conventional CMOS circuits. Generally, dynamic logic gates operate in a precharge phase and an evaluation phase. For example, FIG. 1 schematically illustrates a typical conventional dynamic logic gate 100 of the domino type. In this example, the logic gate 100 implements a three-input AND gate. The logic gate 100 includes a precharge p-channel transistor PC and an evaluation n-channel transistor EV, each having a gate coupled to receive a clock signal CK. The logic gate 100 also includes three n-channel transistors N1–N3 connected in series (i.e. with channel regions connected end-to-end) between the drains of the precharge and evaluation transistors PC and EV. The gates of these three n-channel transistors are connected to respectively receive three input signals A, B, and C. The drain of the precharge transistor PC is also connected to a CMOS inverter 102 (implemented by a p-channel transistor P1 and an n-channel transistor N4) through a node OUTN. The CMOS inverter 102 provides an output signal OUT at an output lead 104.

FIG. 2 is a timing diagram illustrating the operation of the logic gate 100. Although the operation of the logic gate 100 is well known to those skilled in the art of dynamic logic gates, the following description is provided for completeness. A falling edge of the clock signal CK initiates a precharge phase by turning on the precharge p-channel transistor PC and turning off the evaluation n-channel transistor EV. Consequently, during the precharge phase, the precharge transistor PC pulls up the voltage at the node OUTN, thereby causing the CMOS inverter 102 to generate the output signal OUT with a logic low level.

In contrast, a rising edge of the clock signal CK causes the logic gate 100 to enter the evaluation phase by turning off the precharge transistor PC and turning on the evaluation transistor EV. As a result, during the evaluation phase, the precharge transistor PC no longer pulls up the voltage at the node OUTN. In addition, the series connected n-channel transistors N1–N3 and the evaluation transistor EV can implement a conductive path between the node OUTN and ground (e.g., the VSS voltage source). In this example, the input signals A, B, and C all transition to a logic high level during the evaluation phase, thereby causing the n-channel transistors N1–N3 to turn on and discharge the node OUTN. Accordingly, the inverter 102 causes the output signal OUT to transition to a logic high level. Of course, had one or more of the input signals A-C remained at a logic low level during this evaluation phase, the pulldown path would have remained open-circuited, causing the node OUTN and the output signal OUT to remain at a logic high and logic low level, respectively.

FIG. 3 illustrates an exemplary logic subcircuit 300 implemented with interconnected dynamic logic gates 301–306. A flip-flop circuit 308 is connected to provide one or more input signals to the dynamic logic gates 301–306. A flip-flop circuit 310 is connected to receive one or more output signals generated by the dynamic logic gates 301–306. It will be understood by those skilled in the art of dynamic logic that large numbers of subcircuits similar to the logic subcircuit 300 can be interconnected to form a complex circuit such as a microprocessor. A single clock signal CK is used to clock all of the logic gates and flip-flop circuits of the logic subcircuit 300. As a result, while the clock signal CK is at a logic low level (i.e., during the precharge phase) the logic subcircuit 300 performs no logic function. Because the precharge phase of a typical dynamic flip-flop requires about 20%–30% of the cycle time in current CMOS processes, only about 70%–80% of each clock cycle is available for logic operation. The "wasted" 20%–30% results in sub-optimal operation of the logic circuit 300 from a logic operation perspective.

One conventional scheme to more efficiently use each clock cycle is illustrated in FIG. 4. In this scheme, a logic subcircuit 400 is configured so that the flip-flop circuit 308 and the dynamic logic gates 301–303 are connected to receive a first clock signal CK1. The logic gate 303 is connected to provide one or more output signals to a rising edge triggered latch 401, which in turn provides one or more output signals to the dynamic logic gates 304–306. The latch 401 and the logic gates 304–306 are clocked with a second clock signal CK2.

In this type of scheme, the clock signals CK1 and CK2 implement a "non-overlapping" two-phase clocking system. More specifically, as shown in FIG. 5, the clock signal CK2 is the complement of the clock signal CK1. Thus, the precharge and evaluation phases of the clock signal CK1, respectively, do not overlap the precharge and evaluation of the clock signal CK2. Because the clock signals do not overlap, the logic gates driven by the latch 401 will be operating in the precharge phase when the logic gates driven by the flip-flop circuit 308 are operating in the evaluation phase and vice versa. Thus, for example, when the clock signal CK1 is at a logic high level, the logic gates 301–303 perform a logic function on the input signals provided by the flip-flop circuit 308. During this time period, the latch 401 receives the clock signal CK2 with a logic low level, which causes the latch 401 to be disabled. Then, when the clock signals CK1 and CK2, respectively, transition to the logic low and logic high levels, the output signal(s) of the logic gates 301–303 are latched by the latch 401 and provided to the logic gates 304–306, which are now in the evaluation phase. Unlike the logic subcircuit 300 (FIG. 3), this scheme allows the logic subcircuit 400 to perform logic operations during the entire cycle time by "hiding" the precharge time of one group of logic gates during the evaluation phase of the other group of logic gates.

However, the non-overlapping two-phase clocking system has several shortcomings. For example, the latch 401 undesirably increases the propagation delay of the subcircuit by about one gate delay. In addition, skew and jitter between the clock signals CK1 and CK2 is generally accounted for by increasing the set-up time of the latch, resulting in a wasted use of a portion of the cycle time. That is, the latency of the latch 401, in effect, takes time out of the cycle time, thereby reducing the time available in the cycle time for performing logic operations.

Still further, as is well known in the art of dynamic logic, the latch 401 in conjunction with the complementary two phase clocking causes the so-called "quantization effect" which results when the "first" group of logic gates (i.e., logic gates 301–303 in this example) does not have substantially the same propagation delay as the "second" group of logic gates (i.e., logic gates 304–306 in this example). Perfect balance is hard to achieve in practice because of the quantized nature of gate delays. This quantization effect may add up to a gate delay penalty. The combined time penalties due to the insertion of the latch 401 are between approximately two and three gate delays. Thus, there is a need for a dynamic logic clocking system that efficiently uses the entire cycle time for logic operations without the time penalties of the non-overlapped two-phase clocking system.

SUMMARY

In accordance with the present invention, a non-blocking multiple-phase clocking system is provided for use with dynamic logic. In one embodiment, the clocking system includes a clock generator that receives a clock signal and provides a series of delayed clock signals (alternatively referred to herein as clock phases) with overlapping evaluation phases to a circuit or subcircuit including a group of interconnected dynamic logic gates. The circuit also includes a first flip-flop that is coupled to provide one or more input signals to the group of dynamic logic gates and a second flip-flop that is coupled to receive one or more output signals from the group of dynamic logic gates. In particular, the clock generator provides a different clock phase to each dynamic logic gate in the circuit, with each clock phase slightly lagging the clock phase provided to the previous dynamic logic gate in the logic path of the circuit. Consequently, the output signal generated by a dynamic logic gate in a particular clock phase can be evaluated in the next clock phase by the next dynamic logic gate in the logic path. In this manner, signals propagating along a logic path are evaluated in subsequent phases of the clock signal, producing the effect of an evaluation phase that extends from the beginning of the cycle to the end of the cycle. As a result, the precharge operation of a particular clock phase occurs after the next dynamic logic gate has evaluated (or the last flip-flop captures) the output signal of that particular clock phase's associated dynamic logic gate. Thus, the precharge time of each clock phase is "hidden", with no impact on the propagation delay of the signal. Because of the overlapping of the clock signals, no latch is used. As a result, the shortcomings described above arising from the use of a latch and non-overlapping clock signals are avoided.

In a further refinement, the delays between adjacent clock phases are adjusted so that the clock phases are "non-blocking". The term "non-blocking" is used herein to refer to a clock phase that enters the evaluation phase before the arrival of the critical input signal to the dynamic logic gate associated with the clock phase. The term "critical input signal" is used herein to refer to the latest arriving input signal to a particular dynamic logic gate. Consequently, the delays between the clock phases are typically determined after performing a timing analysis of the logic paths of the circuit. Unlike conventional non-overlapped two-phase clocking systems, this feature allows for the dynamic logic gate to immediately operate on the critical input signal(s) in a "non-blocking" manner so that critical signals can propagate through the dynamic logic circuit without the additional time penalties associated with the insertion of latches.

In addition, to ensure that valid output signals are received by the next "downstream" dynamic logic gate, the clock phases are adjusted so that a particular dynamic logic gate receives its critical input signal(s) after the start of the evaluation phase of the clock phase but before the start of the evaluation phase of the subsequent adjacent clock phase. More specifically, by adjusting the delays between the clock phases so that each dynamic logic gate receives its critical input signal(s) before the start of the evaluation phase of any subsequent clock phase, the dynamic logic gate will generate its slowest output signal with at least the minimum pulse width required by the receiving dynamic logic gate(s).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
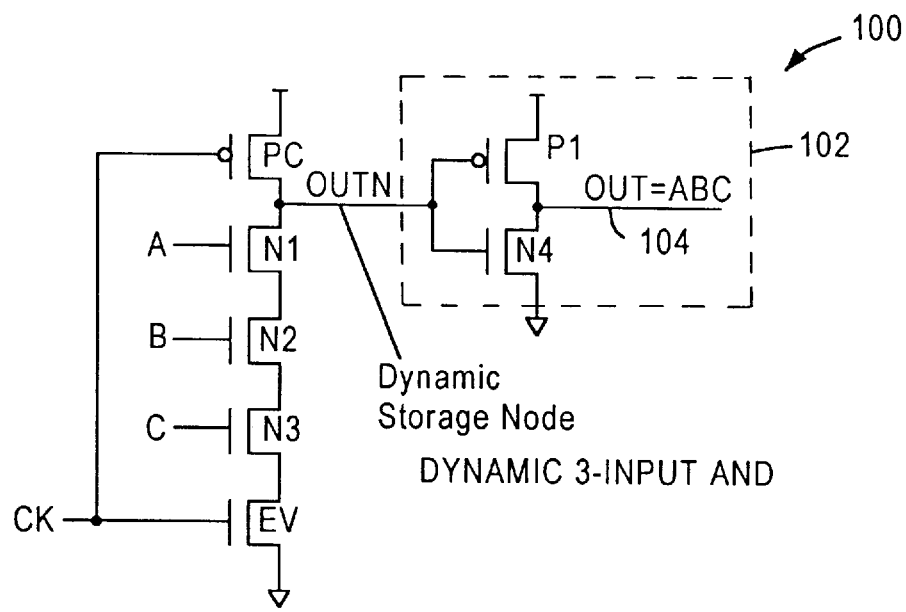
FIG. 1 is a schematic diagram of an exemplary conventional dynamic logic gate.
Figure 2:
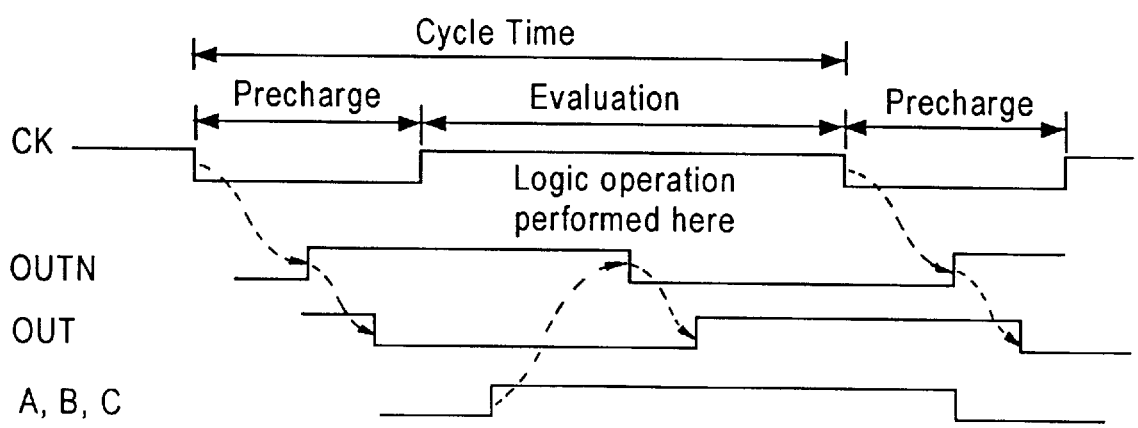
FIG. 2 is a timing diagram illustrative of the operation of a conventional dynamic logic gate.
Figure 3:
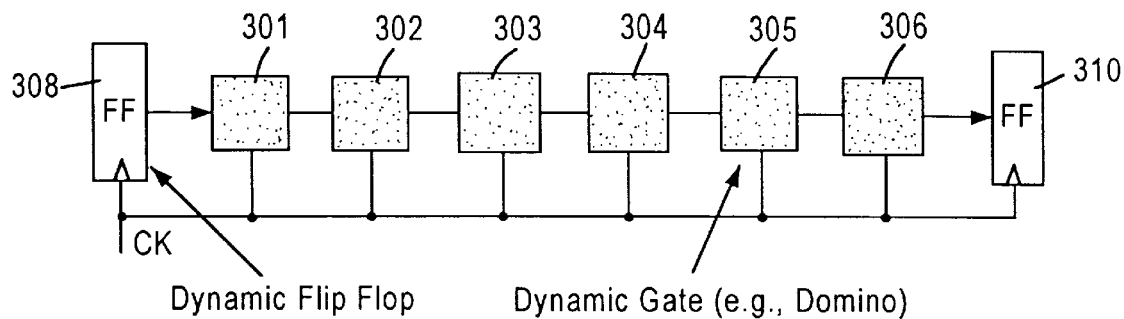
FIG. 3 is a block diagram of a conventional dynamic logic subcircuit for use in a single-phase clocking scheme.
Figure 4:
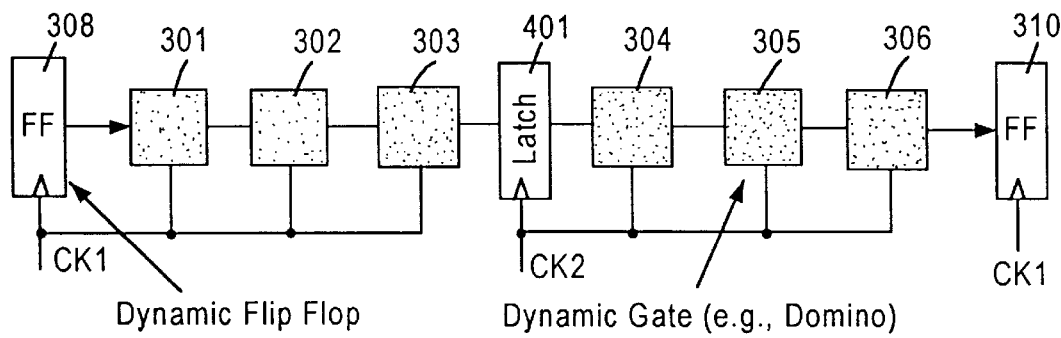
FIG. 4 is a block diagram of a conventional dynamic logic subcircuit for use in a non-overlapping two-phase clocking scheme.
Figure 5:
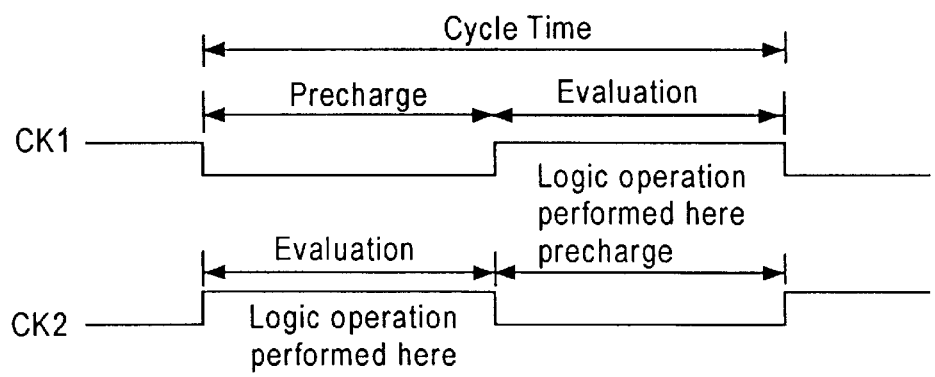
FIG. 5 is a timing diagram illustrating a conventional non-overlapping two-phase clocking scheme.
Figure 6:
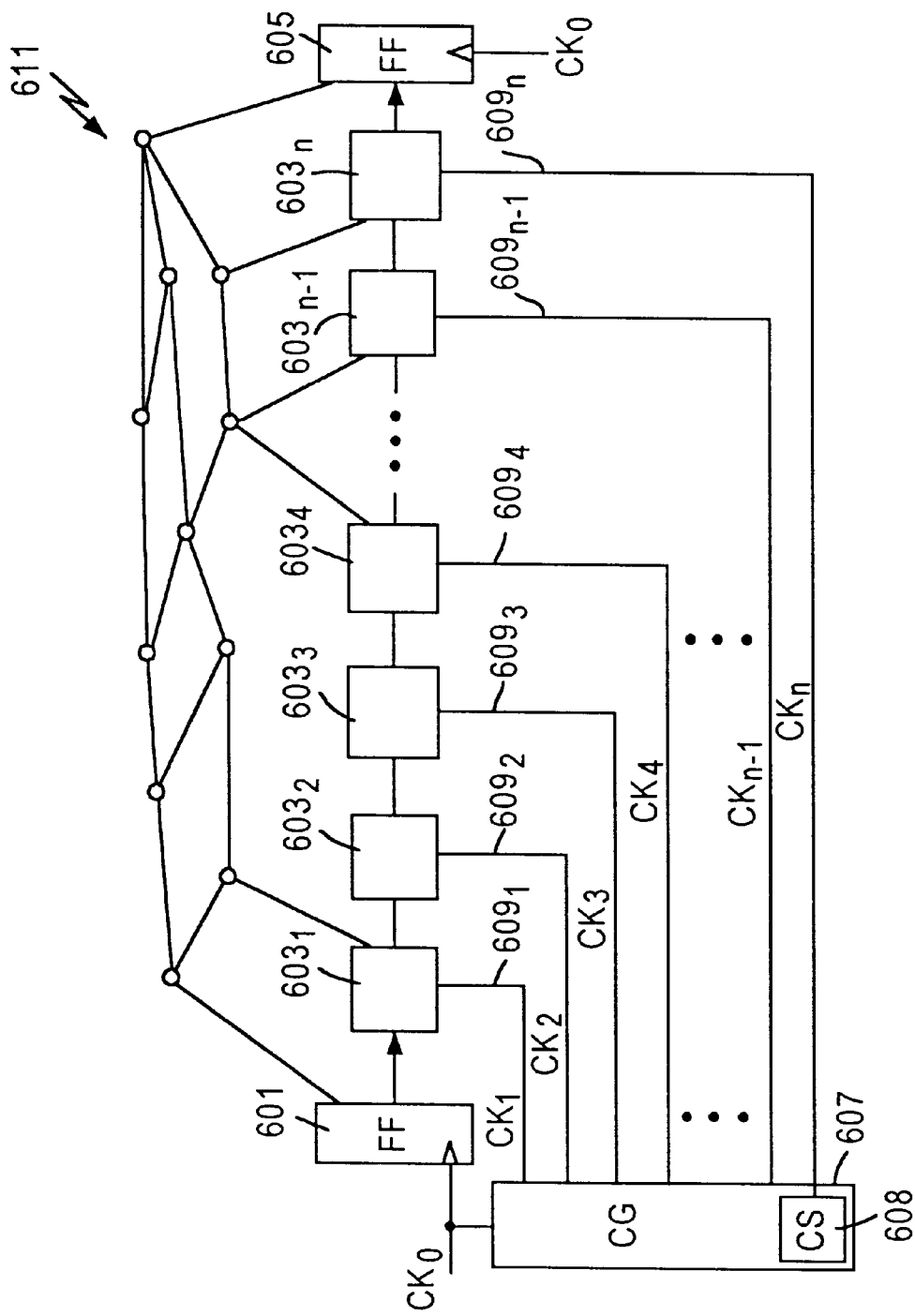
FIG. 6 is a block diagram of a dynamic logic subcircuit using a non-blocking multiple-phase clocking system, according to one embodiment of the present invention.

FIG. 6 is a block diagram of a generalized dynamic logic subcircuit 600 using a non-blocking multiple-phase clocking system according to one embodiment of the present invention. The subcircuit 600 includes a flip-flop 601 and n dynamic logic gates. In this embodiment, the dynamic logic gates are domino logic gates, although in other embodiments other types of dynamic logic may be used. More specifically, the subcircuit includes dynamic logic gates $603_1$–$603_n$. Of course, in some embodiments, "n" dynamic logic gates may be as few as two dynamic logic gates, depending on the application. The subcircuit 600 also includes a second flip-flop 605 and a clock generator 607.

With reference to FIG. 6, those skilled in the art of dynamic logic circuits will appreciate that the dynamic logic circuits $603_1$–$603_n$ represent one logic path through the subcircuit 600. In addition, the subcircuit 600 may include other dynamic logic gates, for example, dynamic logic gates 611, in a multiple tree structure for providing desired logic functions. In this example circuit, the dynamic logic gates are interconnected with the dynamic logic gates $603_1$–$603_n$. Of course, in other embodiments the number of dynamic logic gates and the interconnection between the dynamic logic gates depends on the application.

The subcircuit 600 is interconnected as follows. The dynamic logic gates $603_1$–$603_n$ are connected in series or cascade, with the dynamic logic gate $603_1$ generating output signals that serve as input signals to (i.e., "driving") the dynamic logic gate $603_2$. Similarly, the dynamic logic gate $603_2$ provides an input signal(s) to the dynamic logic gate $603_3$ and so on, with the dynamic logic gate $603_{n-1}$ driving the dynamic logic gate $603_n$. The flip-flop 601 is connected to provide an input signal to the first dynamic logic gate $603_1$ in the logic path, whereas the flip-flop 605 is connected to receive the output signal of the last flip-flop $603_n$ in the logic path. The flip-flops 601 and 605 are clocked by a primary clock signal $CK_0$.

The clock generator 607 is connected to receive the primary clock signal $CK_0$ and to provide clock signals with overlapping evaluation phases to the n sets of dynamic logic gates. In this embodiment, the dynamic logic gate $603_1$ is connected to receive a clock phase $CK_1$ from the clock generator 607 through a line $609_1$. Similarly, the clock generator 607 provides a clock signal $CK_2$ to the dynamic logic gate $603_2$ through a line $609_2$ and so on, with the clock generator 607 providing a clock signal $CK_n$ to the dynamic logic gate $603_n$ through a line $609_n$.

In accordance with the present invention, the clock generator 607 provides n clock phases $CK_1$–$CK_n$ to the n dynamic gates $603_1$–$603_n$, with each clock phase being received by the corresponding dynamic logic gate. In particular, the clock generator 607 inserts a delay between each clock phase so that the clock phases so that each dynamic logic gate in the logic path receives a clock phase overlapping and slightly lagging the clock phase received by the previous dynamic logic gate in the logic path. Further, in accordance with the present invention, the delays are predetermined so that the clock phases are non-blocking. The clock generator 607 also includes a clock stretcher 608 (described below in conjunction with FIG. 7) for generating the last clock phase $CK_n$. Because the clock phases are overlapping and non-blocking, each dynamic logic gate can immediately operate on the critical input signal(s) upon receipt of the critical signal without having to wait for the clock phase received by this particular dynamic logic gate to enter the evaluation phase. Thus, the critical signals can propagate through the subcircuit 600 without the additional time penalties associated with the insertion of latches described above.

Figure 7:
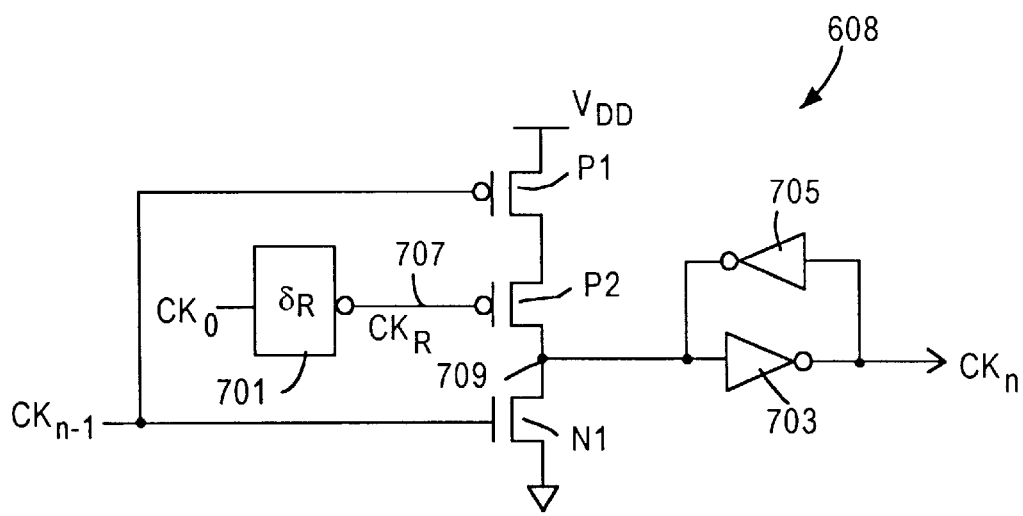
FIG. 7 is a circuit diagram of a clock stretcher according to one embodiment of the present invention.

FIG. 7 is circuit diagram of the clock stretcher 608 (FIG. 6). The clock stretcher operates to ensure that the evaluation phase of the last clock phase extends past the primary clock cycle boundary (i.e., extends beyond the leading edge of the next cycle of the primary clock). This feature becomes important when clocking at low frequencies (e.g., during testing of commercial integrated circuits using this clocking system). The evaluation phase of the last clock phase must be so extended because at low frequencies, the last clock phase may enter the next precharge phase well before the start of the next primary clock cycle, thereby losing the evaluated output signal of the last dynamic logic gate before being sampled by the flip-flop 605. That is, because the flip-flop 605 samples the output signal from the last dynamic logic gate $603_n$ at the leading edge of the next primary clock cycle, the evaluation phase of the last phase must be extended into the next primary clock cycle to ensure that the evaluated output signal of the dynamic logic gate $603_n$ is sampled.

This embodiment of the clock stretcher 608 includes two p-channel transistors P1 and P2, an n-channel transistor N1, an inverting delay buffer 701 and two inverters 703 and 705. The inverting delay buffer 701 has an input lead connected to receive the primary clock signal $CK_0$. The inverting delay buffer 701 can be implemented with a single inverter or, alternatively, three series connected inverters, so as to provide a delayed and inverted version (i.e., clock signal $CK_R$) of the primary clock signal CK0 on an output lead 707. In this example, the delay provided by the inverting delay buffer 701 is denoted $\delta_R$.

The transistor P1 has its source connected to a VDD voltage source, its gate connected to receive the penultimate clock phase $CK_{n-1}$, from the clock generator 607 (FIG. 6) and its drain connected to the source of the transistor P2. The transistor P2 has its gate connected to receive the clock signal $CK_R$ from the inverting delay buffer 701, and its drain connected to the drain of the transistor N1 (through an internal node 709. The transistor N1 has its gate connected to receive the clock phase $CK_{n-1}$, and its source connected to a ground source (i.e., GROUND). The inverters 703 and 705 form a latch circuit connected to invert and latch the voltage present at the internal node 703. More specifically, the input lead of the inverter 703 is connected to the internal node 709 and to the output lead of the inverter 705. The output lead of the inverter 703 is connected to the input lead of the inverter 705. The latch formed by the inverters 703 and 705 provides the last clock phase $CK_n$ at the output lead of the inverter 703.

The clock stretcher 608 operates as follows. At the start of the evaluation phase (i.e., the rising edge) of the previous adjacent clock phase $CK_{n-1}$, the voltage at the internal node 709 is discharged to a logic low level regardless of the logic level of the clock signal $CK_R$. As a result of this logic low level, the latch formed by the inverters 703 and 705 causes the clock phase $CK_n$ to be at a logic high level. However, when the clock phase $CK_{n-1}$ transitions to a logic low level when its evaluation phase ends, the voltage at the internal node 709 is not pulled up unless the clock signal $CK_R$ transitions to a logic high level. Because the clock signal $CK_R$ is a delayed (i.e., by duration $\delta_R$) and inverted version of the primary clock signal $CK_0$, the clock signal $CK_R$ does not transition to a logic high level until after the primary clock signal $CK_0$ enters the next evaluation phase. More specifically, the falling edge of the clock signal $CK_R$ (which occurs $\delta_R$ after the rising edge of the primary clock signal $CK_0$) the voltage at the internal node 709 is pulled up to a logic high level, thereby causing the clock phase $CK_n$ to transition to a logic low level. Accordingly, even at low frequencies, the clock phase $CK_n$ is "stretched" so that the evaluation phase of the clock phase $CK_n$ extends beyond the boundary of the next cycle of the primary clock signal $CK_0$. This stretching of the clock phase $CK_n$ helps to ensure that the flip-flop 605 (FIG. 6) can sample the output signal(s) of the dynamic logic gate $603_n$ (FIG. 6).

Figure 8:
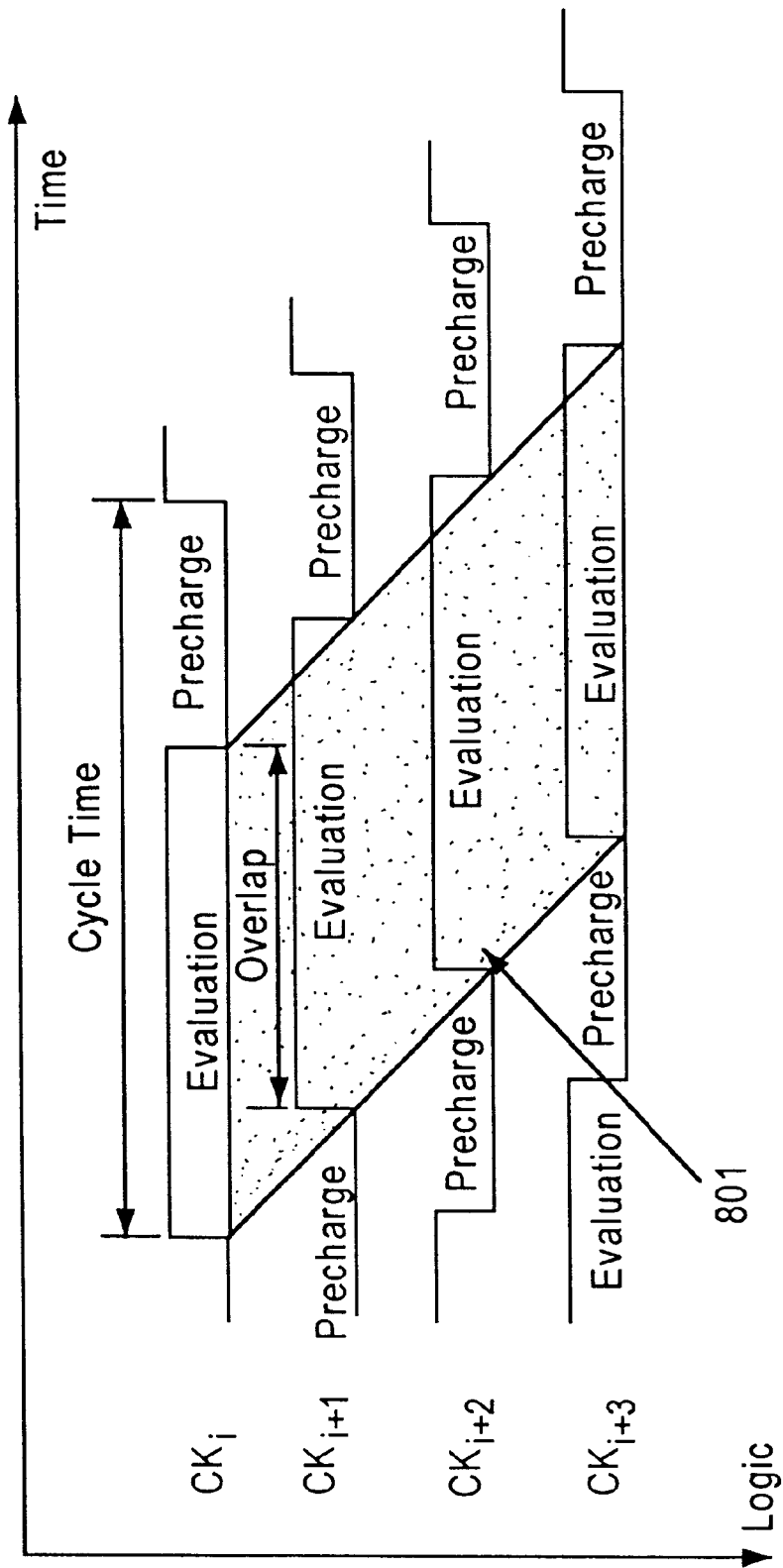
FIG. 8 is a timing diagram illustrating the clock signal timing of one embodiment of a non-blocking multiple-phase clocking system according to the present invention.

FIG. 8 is a timing diagram illustrating the timing of three of the clock phases generated by the clock generator 607 (FIG. 6). Thus, referring to FIGS. 6 and 8, the subcircuit 600 operates as follows with respect to the logic path defined by the dynamic logic gates $603_1$–$603_n$. The clock generator 607 provides the clock phases $CK_1$ through $CK_n$ to the dynamic logic gates $603_1$–$603_n$ so that relative to an arbitrary clock phase $CK_i$, the adjacent or next subsequent clock phase $CK_{i+1}$ lags the clock phase $CK_i$, by a predetermined time period. This delay causes the evaluation phases of the clock phases $CK_1$ and $CK_{i+1}$ to overlap. In this embodiment, the predetermined delay between the clock phases $CK_1$ and $CK_{i+1}$ is predetermined to be non-blocking (i.e., short enough in duration so that the clock phase $CK_{i+1}$ is received by the (i+1)th dynamic logic gate before the arrival of the critical signal(s) received by the (i+1)th dynamic logic gate.

In this embodiment, each dynamic logic gate of the subcircuit 600 enters the evaluation phase when the logic gate's corresponding clock signal transitions to a logic high level and enters the precharge phase when the logic gate's clock signal transitions to a logic low level. The evaluation overlap time between clock signals $CK_i$ and $CK_{i+1}$ is defined herein as the time period between the rising edge of the clock signal $CK_{i+1}$ and the falling edge of the clock signal $CK_i$.

The clock generator 607 generates the next adjacent clock signal $CK_{i+2}$ lagging the clock signal $CK_{i+1}$ by a predetermined time period, defining an evaluation overlap time from the rising edge of the clock signal $CK_{i+2}$ and the falling edge of the clock signal $CK_{i+1}$. Likewise, the clock generator 607 generates the next adjacent clock signal $CK_{i+3}$ lagging the clock signal $CK_{i+2}$ with a predetermined delay, and so on until the last clock signal $CK_n$ is generated. Together, all of the evaluation overlap times form an evaluation region 801. As can be seen in FIG. 8, over the entire cycle time, at least one clock signal is in the evaluation phase. This feature allows an output signal that is generated by a dynamic logic gate in one evaluation phase to be used as an input signal to a dynamic logic gate in a subsequent evaluation phase. In this manner, the entire cycle time can be used by the subcircuit 600 to perform logic operations, which can significantly increase the speed of the subcircuit 600.

Figure 9:
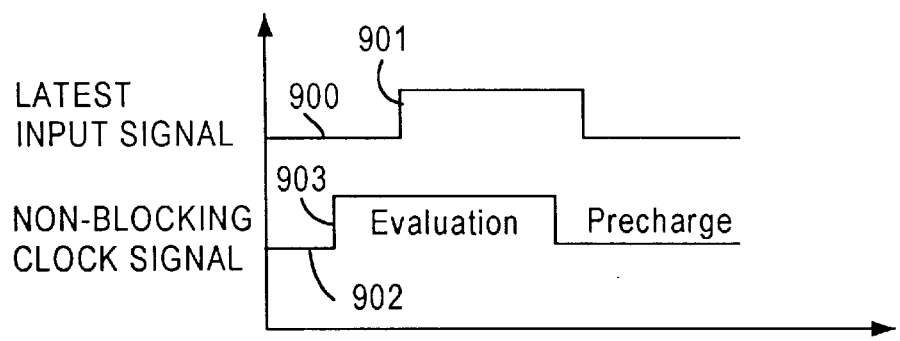
FIG. 9 is a timing diagram illustrating a blocking clock signal.
Figure 10:
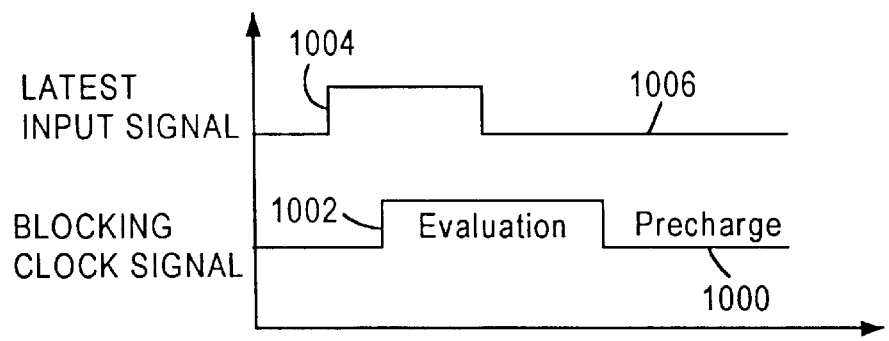
FIG. 10 is a timing diagram illustrating a non-blocking clock signal.

By adjusting each delay between adjacent clock phases so that, for all of the dynamic logic gates, the clock phases are "non-blocking", the speed of the subcircuit 600 can be further increased. The term "non-blocking" is used herein to denote that the clock phase received by a particular dynamic logic gate enters the evaluation phase before that dynamic logic gate receives its latest arriving or critical input signal. FIG. 9 is a timing diagram illustrating a non-blocking clock signal. The input signal 900 is the critical signal received by the dynamic logic (not shown). The leading edge 901 of the critical input signal 900 occurs after the leading edge 903 (also a rising edge in this example) of the clock signal 902 received by the dynamic logic gate. Conversely, FIG. 10 illustrates a "blocking" clock signal 1000. The leading edge 1002 of the blocking clock signal 1000 arrives at the dynamic logic gate (not shown) after the leading edge 1004 of the latest arriving input signal 1006.

By predetermining each delay between adjacent clock phases so that each dynamic logic gate receives its clock phase in a non-blocking manner, each dynamic logic gate can evaluate the logic gate's logic operation immediately upon receiving the latest input signal and need not "wait" for the evaluation phase to begin. It will be understood by those skilled in the art of dynamic logic that in FIG. 9, the non-blocking time of the dynamic logic gate is zero (the term "non-blocking time" is used herein to refer to the time the evaluation phase must precede the arrival of the input signal to prevent blocking). If the non-blocking time is non-zero, then the leading edge of the clock signal must arrive a certain minimum time before the arrival of the input signal.

For a given clock frequency, the number, duty cycle and the evaluation overlap of the clock phases can be determined by the designer, depending on the timing characteristics of the critical signals and of the dynamic logic gates. For example, the timing characteristics of the dynamic logic gates include the minimum input signal pulse width, the propagation delay, precharge time and the reset time (i.e., the time required to precharge the dynamic logic gate to 50% of the VDD voltage) of each dynamic logic gate. For example, the evaluation overlap must be long enough so that any output signal generated by a dynamic logic gate clocked during a clock phase $CK_i$ has a pulse width at least as long as the minimum pulse width required by the dynamic logic gate clocked by the clock phase $CK_{i+1}$. Once the minimum evaluation overlap time is determined, the phase delay or lag between adjacent clock phases must be set so that the critical signals are received by a dynamic logic gate after the dynamic logic gate receives its clock phase. Consequently, in this process, a timing analysis of each logic path must be performed. Once the arrival time of each critical signal is known, the adjustment of the clock phases can then be performed. In some cases, it may not be possible to find a set of delays that are nonblocking while meeting the evaluation overlap requirements of the dynamic logic gates.

Of course, to standardize the clock generator and ease the design process, the clock phases may be designed with a predetermined duty cycle and time lag so as result in an evaluation overlap with sufficient margin to "beat" the arrival of all of the critical signals in the subcircuit while ensuring a safe transition of signals across adjacent clock phases. This standardized scheme is advantageously used for predominantly "regular" (as opposed to random) logic circuits in which the arrival times of the critical input signals tend to be similar for all of the dynamic logic gates in the subcircuit. Further, to maximize the speed of the entire circuit, the delay between clock phases should be determined so that the clock phases are non-blocking for all of the critical signals. This analysis tends to be more practical for regular circuits than for random combinational circuits, which typically have a very large number of critical paths that must be analyzed and adjusted for.

Figure 11:
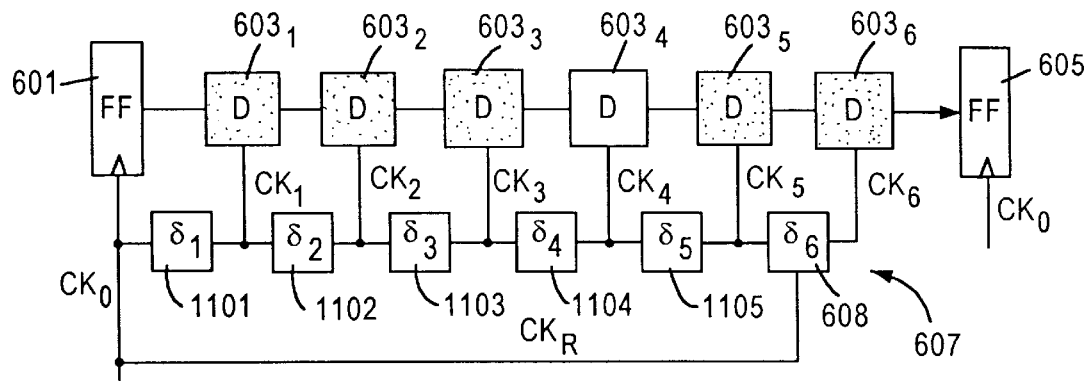
FIG. 11 is a circuit diagram of a clock generator according to one embodiment of the present invention.

FIG. 11 is a circuit diagram of one embodiment of the clock generator 607 (FIG. 6) having six domino-type dynamic logic gates, according to the present invention. The clock generator 607 includes non-inverting delay circuits 1101–1105 in addition to the clock stretcher 608 (FIG. 6) and the inverting delay buffer 701 (FIG. 7). In particular, the first non-inverting delay circuit 1101 is connected to receive the primary clock signal $CK_0$ provides a clock phase $CK_1$ to the first dynamic logic gate 603₁ and the second non-inverting delay circuit 1102. The clock phase $CK_1$ is equivalent to the primary clock signal $CK_0$ delayed by duration $\delta_1$. Similarly, the second non-inverting delay circuit 1102 provides a clock phase $CK_2$ to the second dynamic logic gate 603₂ and the second non-inverting delay circuit 1103. The clock phase $CK_2$ is equivalent to the clock phase $CK_1$ delayed by duration $\delta_2$. Likewise, the third non-inverting delay circuit 1103 provides a clock phase $CK_3$ to the third dynamic logic gate 603₃ and the fourth non-inverting delay circuit 1104 and so on, until the fifth non-inverting delay circuit 1105. Instead, the fifth non-inverting delay circuit 1105 provides the clock phase $CK_5$ to the fifth dynamic logic gate 603₅ and the clock stretcher 608. In this embodiment, the clock stretcher 608 (described above in conjunction with FIG. 7) provides the clock phase $CK_6$ that is "stretched" to ensure that the clock phase $CK_6$ only enters the evaluation phase after the next cycle of the primary clock signal $CK_0$ begins. In this embodiment, the non-inverting delay circuits 1101–1105 are implemented using two inverters that are connected series. The durations $\delta_1$–$\delta_6$ of the delays provided by the non-inverting delay circuits 1101–1105 and the inverting delay circuit 608 can be adjusted by adjusting the size of the inverters implementing these delay circuits, or by "skewing" these inverters, or even by inserting an even number of series-connected inverters.

Figure 12:
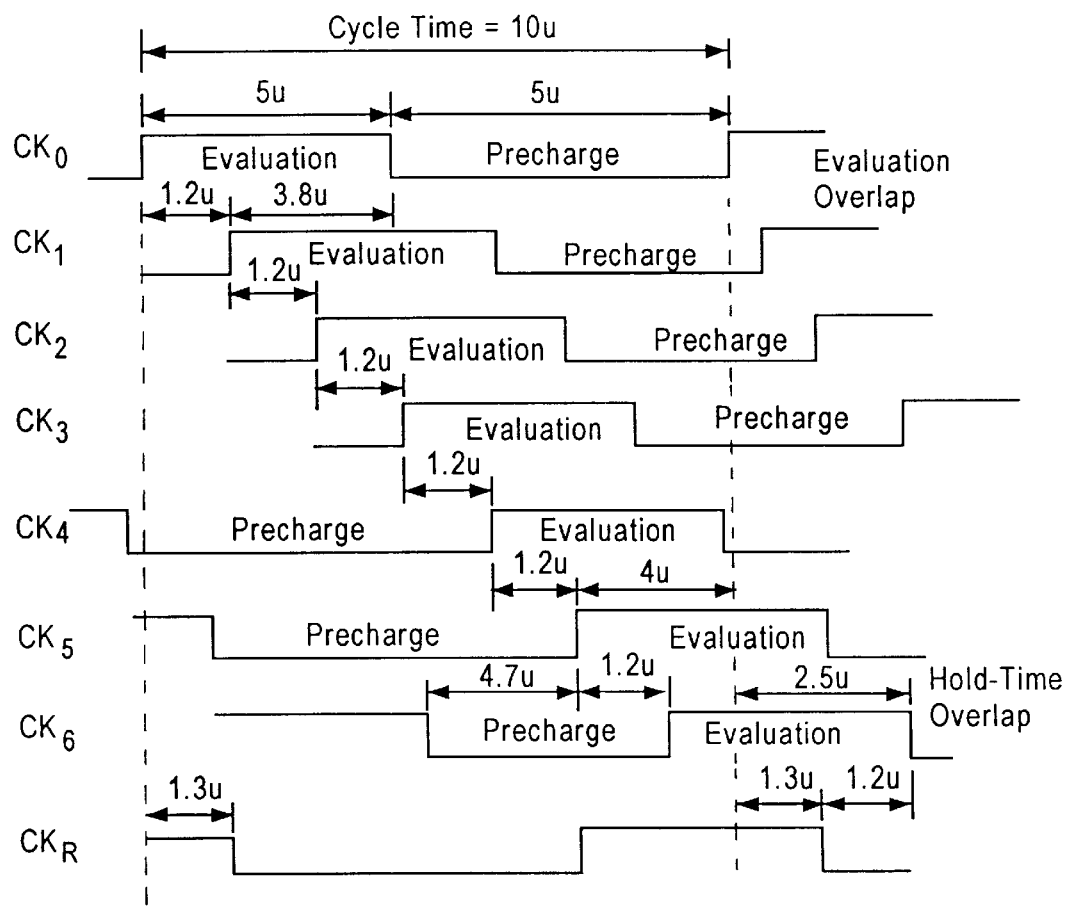
FIG. 12 is a timing diagram illustrative of the signal flow in the circuit of FIG. 11, according to one embodiment of the present invention.

FIG. 12 is a timing diagram illustrating the operation of the clock generator 607 (FIG. 11), according to one embodiment of the present invention. Referring to FIGS. 11 and 12, the clock generator 607 operates as follows. In this example, the cycle time of the primary clock signal $CK_0$ (and the clock phases $CK_1$–$CK_6$) is equivalent to ten unit gate delays (i.e., 10 u, where 1 u=one unit gate delay). The six clock phases were predetermined to have a duty cycle in which the precharge phase is about 50% of the cycle time or 5 u. Thus, the evaluation phase is also about 50% of the cycle time or 5 u. The clock stretcher 608 introduces a delay of about 1.2 u relative to the clock phase $CK_5$. Similarly, each non-inverting delay circuit 1101–1105 also introduces a delay of about 1.2 u, resulting in an evaluation overlap of about 38% between adjacent clock phases.

The clock stretcher 608 provides the clock phase $CK_6$ so that the clock phase $CK_6$ overlaps the evaluation phase of the next cycle time of the primary clock signal $CK_0$ of 25% of the cycle time or 2.5 u. This overlap is referred to herein as the "hold time overlap". The hold time overlap must be large enough to ensure that any output signal generated by the dynamic logic gate $603_6$ during the evaluation phase of the clock phase $CK_6$ can be correctly received by the flip-flop 605. Because the flip-flop 605 is typically edge-triggered, the hold time overlap can be significantly shorter than the evaluation overlap required by the dynamic logic gates. FIG. 12 also shows the delayed and inverted clock signal $CK_R$, which is used by the clock stretcher 608 in generating the clock phase $CK_6$. In this example, the clock signal $CK_R$ is delayed relative to the primary clock signal $CK_0$ by about 1.3 u. Thus, when added to a delay of about 1.2 u provided by the clock stretcher 608, the hold time overlap is about 2.5 u.

For many applications, the 1.2 u delay between adjacent clock phases is short enough to make the clock phases non-blocking while providing enough overlap to guarantee a safe transition of signals across adjacent clock phase boundaries. The precharge time of 5 u is typically more than large enough to precharge the dynamic logic gates. The 5 u evaluation overlap provides a relatively large margin for valid transition of output signals across adjacent clock signals and accounting for clock signal skew and jitter. The hold time overlap of 2.5 u is large enough to satisfy the hold time requirements of typical edge-triggered flip-flops in the presence of clock skew and jitter.

Figure 13:
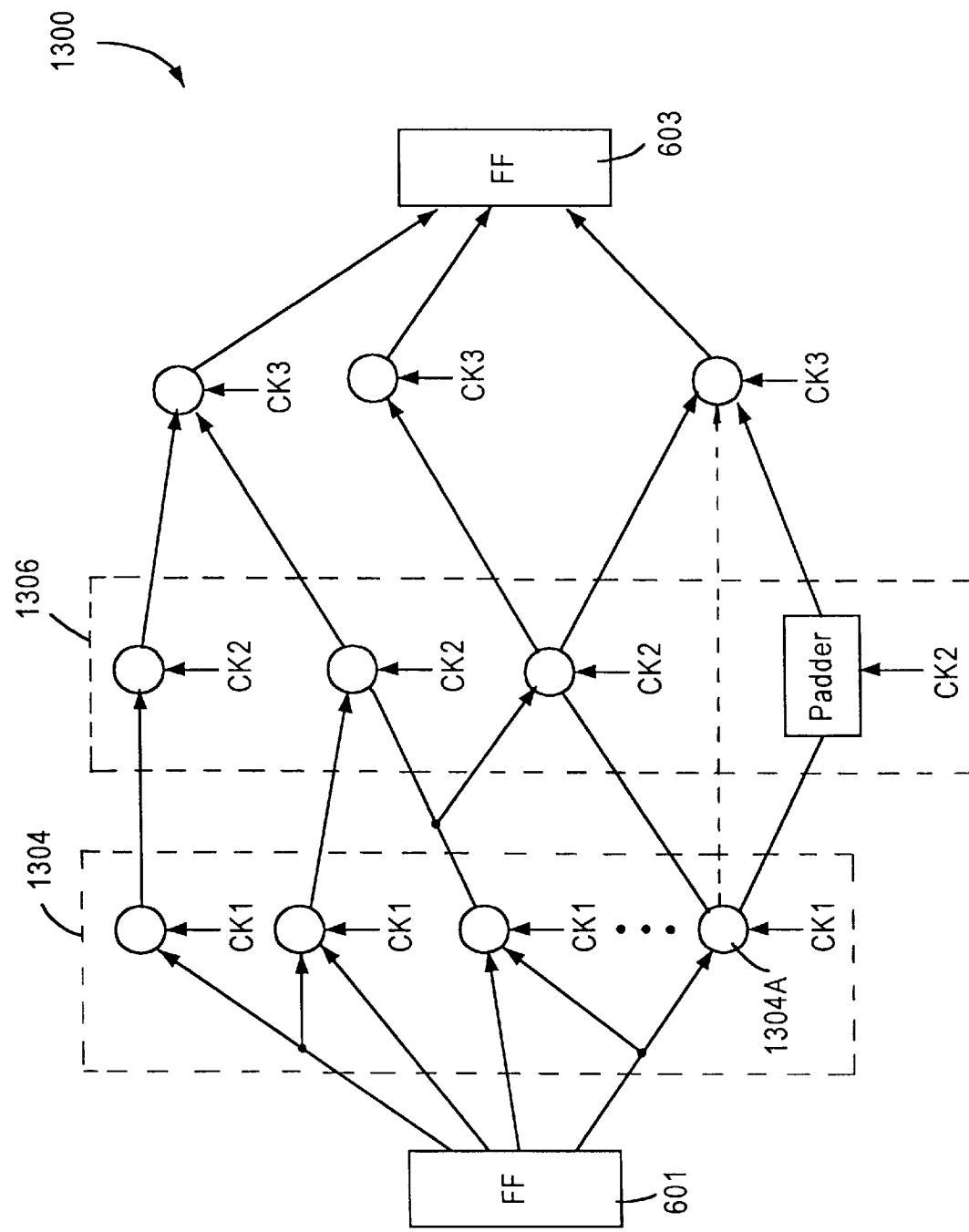
FIG. 13 is a block diagram of an exemplary dynamic logic subcircuit illustrating a skipped clock phase.

FIG. 13 is a block diagram of a dynamic logic gate subcircuit 1300 with a padder gate 1302 to avoid skipping a clock phase. The padder gate 1302 is a dynamic non-inverting delay gate that merely passes the received input signal to its output lead. In this example, the subcircuit 1300 includes dynamic logic gates 1304 connected to receive the clock phase $CK_1$ and input signals from the flip-flop 601. In this example, additional dynamic logic gates 1306, as well as the padder gate 1302, are coupled to receive the output signals from the dynamic logic gates 1304 and the clock signal $CK_2$. The padder gate 1302 and the dynamic logic gates 1306 are coupled to provide output signals to dynamic logic gates 1308, which are clocked by the clock signal $CK_3$.

However, as indicated by the dashed line 1310, the output lead of the dynamic logic gate 1304A was originally connected to the input lead of the dynamic logic gate 1308A. Thus, in the logic path leading from the dynamic logic gate 1304A to the dynamic logic gate 1308A, the clock phase $CK_2$ was skipped. Because a clock phase was skipped, the output signal provided by the dynamic logic gate 1304A might not meet the minimum input signal pulse width required by the dynamic logic gate 1308A. Thus, the padder gate 1302 is inserted to receive the output signal from the dynamic logic gate 1304A and propagate this output signal unchanged to the dynamic logic gate 1608A, after a delay. Because the padder gate 1302 is clocked by the clock phase $CK_2$, the output signal generated by the padder gate 1302 is ensured to meet the minimum pulse width requirement of the dynamic logic gate 1308A. In accordance with the present invention, whenever a skipped clock phase occurs in a logic path, a padder gate is inserted and coupled to receive the skipped clock phase.

The embodiments of the non-blocking multiple-phase clocking system described above are illustrative of the principles of this invention and are not intended to limit the invention to the particular embodiments described. For example, different implementations of the clock generator can be used, along with different duty cycles and delay times, to optimize the performance of the dynamic logic subcircuit. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A circuit for providing clock phases to a plurality of n dynamic logic gates, the plurality of dynamic logic gates being connected in series with a first dynamic logic gate connected to a second dynamic logic, the second dynamic logic gate being connected to a third dynamic logic gate and so on until the nth dynamic logic gate, n being an integer greater than one, the circuit comprising:

a plurality of n delay circuits connected in series, a first delay circuit of said plurality being coupled to receive a primary clock signal and configured to provide a first clock phase delayed relative to the primary clock signal, a second delay circuit coupled to receive the first clock phase and configured to provide a second clock phase delayed relative to the first clock phase and so on, with said nth delay circuit being coupled to receive an (n−1) th clock phase and configured to provide an nth clock phase delayed relative to the (n−1) th clock phase, wherein the first dynamic logic gate is coupled to receive the first clock phase, the second dynamic logic gate is coupled to receive the second clock phase and so on with the nth dynamic logic gate being coupled to receive the nth clock phase.

2. The circuit of claim 1 wherein the delays between the n clock phases are predetermined so that each clock phase is non-blocking.

3. The circuit of claim 1 wherein the plurality of delay circuits each include a set of series-connected inverters to provide said delays.

4. The circuit of claim 1 wherein the n clock phases have substantially equal duty cycles.

5. The circuit of claim 1 wherein each pair of adjacent clock phases has an evaluation overlap with a duration at least as great as a minimum pulse width of the dynamic logic gate coupled to receive the later clock phase of the pair of clock phases, summed with a propagation delay of the dynamic logic gate coupled to receive the earlier clock phase of the pair of clock phases and minus a reset time of the dynamic logic gate coupled to receive the later clock phase of the pair of clock phases.

6. The circuit of claim 5 wherein each pair of adjacent clock phases of the n clock phases have evaluation overlaps that are substantially equal.

7. The circuit of claim 1 wherein the plurality of delay circuits provide delays that are substantially equal.

8. The circuit of claim 1 wherein the evaluation phase of the nth clock phase extends beyond the leading edge of the next clock cycle of the primary clock signal by a duration at least equal to a hold time of a flip-flop coupled to receive an output signal of the nth dynamic logic gate.

9. The circuit of claim 1 further comprising a padder coupled in series between a kth dynamic logic gate and a (k+1) th dynamic logic gate, the kth dynamic logic gate being coupled to receive a kth clock phase, the padder being coupled to receive a (k+1) th clock phase and the (k+1) th dynamic logic gate being coupled to receive a (k+2) th clock phase, k being an integer between two and (n−2), wherein the kth clock phase, (k+1) th clock phase and the (k+2) th clock phase are three adjacent clock phases of the n clock phases.

10. The circuit of claim 1 wherein a clock stretcher coupled to receive the (n−1) th clock phase and configured to provide an nth clock phase delayed relative to the (n−1) th clock phase, said clock stretcher further configured to provide the nth clock phase so that an evaluation phase of the nth clock phase does not end until after a next evaluation phase of the primary clock signal begins.

11. A circuit for providing clock phases to a plurality of n dynamic logic gates, the plurality of dynamic logic gates being connected in series with a first dynamic logic gate connected to a second dynamic logic, the second dynamic logic gate being connected to a third dynamic logic gate and so on until the nth dynamic logic gate, n being an integer greater than one, the circuit comprising:

means, coupled to receive a primary clock signal, for providing a first clock phase, a second clock phase and so on until a nth clock phase, said first clock phase being delayed relative to the primary clock signal, said second phase being delayed relative to the first clock phase, and so on with said nth clock phase being delayed relative to a (n−1) th clock phase, wherein the first dynamic logic gate is coupled to receive the first clock phase, the second dynamic logic gate is coupled to receive the second clock phase and so on with the nth dynamic logic gate being coupled to receive the nth clock phase.

12. The circuit of claim 11 wherein the delays between the n clock phases are predetermined so that each clock phase is non-blocking.

13. The circuit of claim 11 wherein each pair of adjacent clock phases has an evaluation overlap with a duration at least as great as a minimum pulse width of the dynamic logic gate coupled to receive the later clock phase of the pair of clock phases, summed with a propagation delay of the dynamic logic gate coupled to receive the earlier clock phase of the pair of clock phases and minus a reset time of the dynamic logic gate coupled to receive the later clock phase of the pair of clock phases.

14. The circuit of claim 11 wherein the evaluation phase of the nth clock phase extends beyond the leading edge of the next clock cycle of the primary clock signal by a duration at least equal to a hold time of a flip-flop coupled to receive an output signal of the nth dynamic logic gate.

15. The circuit of claim 11 further comprising a padder coupled in series between a kth dynamic logic gate and a (k+1) th dynamic logic gate, the kth dynamic logic gate being coupled to receive a kth clock phase, the padder being coupled to receive a (k+1) th clock phase and the (k+1) th dynamic logic gate being coupled to receive a (k+2) th clock phase, k being an integer between two and (n−2), wherein the kth clock phase, (k+1) th clock phase and the (k+2) th clock phase are three adjacent clock phases of the n clock phases.

16. The circuit of claim 11 wherein a clock stretcher coupled to receive the (n−1) th clock phase and configured to provide an nth clock phase delayed relative to the (n−1) th clock phase, said clock stretcher further configured to provide the nth clock phase so that an evaluation phase of the nth clock phase does not end until after a next evaluation phase of the primary clock signal begins.

17. A circuit comprising:

a clock generator coupled to receive a clock signal $CK_0$, wherein said clock generator is configured to output n clock signals $CK_1, \ldots, CK_n$, n being an integer greater than one, a clock period of said clock signal $CK_0$ defining a cycle time, said n clock signals each having a precharge phase and an evaluation phase, a leading edge of each of said n clock signals initiating each said evaluation phase, wherein the leading edge of a clock signal $CK_i$ occurs between the leading edges of clock signals $CK_{i-1}$ and $CK_{i+1}$, i being an integer within the range of two and (n−1), inclusive, so that said evaluation phases having overlapping portions;

a first flip-flop coupled to receive clock signal $CK_0$;

a plurality of cascaded dynamic logic pates including a $1^{st}, 2^{nd}, \ldots$ nth dynamic logic gates, an output lead of the $1^{st}$ dynamic logic gate being connected to an input lead of the $2^{nd}$ dynamic logic gate, an output lead of the $2^{nd}$ dynamic logic gate being connected to an input lead of a $3^{rd}$ dynamic logic gate and so on with an output lead of a $(n-1)^{th}$ dynamic logic gate being connected to an input lead of the nth dynamic logic gate;

a second flip-flop coupled to receive an output signal from the nth dynamic logic gate logic gate, wherein the ith dynamic logic gate is coupled to receive the ith clock signal.

18. The circuit of claim 17 wherein, within one cycle time, the ith dynamic logic gate of said plurality of dynamic logic gates is configured to receive the clock signal $CK_i$ so that this dynamic logic gate receives a leading edge of a latest arriving input signal after the leading edge of the clock signal $CK_i$ occurs and before the leading edge of the clock signal $CK_{i+1}$ occurs.

19. The circuit of claim 18 wherein the overlap time portion between the ith clock signal and the (i+1) th clock signal has a duration greater than a minimum input signal pulse width required of the (i+1) th dynamic logic gate of the plurality of dynamic logic gates.

20. The circuit of claim 17 wherein the plurality of logic gate are domino type dynamic logic gates.

* * * * *